United States Patent
Bai et al.

(10) Patent No.: US 10,582,307 B2
(45) Date of Patent: Mar. 3, 2020

(54) MEMS MICROPHONE

(71) Applicant: AAC ACOUSTIC TECHNOLOGIES (SHENZHEN) CO., LTD., Shenzhen (CN)

(72) Inventors: Yang Bai, Shenzhen (CN); Rui Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/234,567

(22) Filed: Dec. 28, 2018

(65) Prior Publication Data

US 2019/0246214 A1 Aug. 8, 2019

(30) Foreign Application Priority Data

Feb. 6, 2018 (CN) ................. 2018 2 0210098 U

(51) Int. Cl.
*H04R 25/00* (2006.01)
*H04R 19/04* (2006.01)
*H04R 19/00* (2006.01)
*H04R 1/04* (2006.01)
*B81B 3/00* (2006.01)

(52) U.S. Cl.
CPC ........... *H04R 19/04* (2013.01); *B81B 3/0072* (2013.01); *H04R 1/04* (2013.01); *H04R 19/005* (2013.01); *B81B 2201/0257* (2013.01); *B81B 2203/0127* (2013.01); *H04R 2201/003* (2013.01)

(58) Field of Classification Search
CPC .......... H04R 25/00; H04R 19/04; H04R 1/22; H04R 1/222; H04R 2499/11
See application file for complete search history.

(56) References Cited

U.S. PATENT DOCUMENTS

2015/0271617 A1* 9/2015 Langlois ................ H04R 1/222
216/17

* cited by examiner

*Primary Examiner* — Amir H Etesam
(74) *Attorney, Agent, or Firm* — IPro, PLLC; Na Xu

(57) ABSTRACT

The present disclosure provides an MEMS microphone, including a substrate having a back cavity and a capacitor system fixedly disposed on the substrate, where the capacitor system includes a backplane and a vibrating diaphragm that are spaced apart from each other, the backplane includes a backplane insulation layer and a backplane conducting layer disposed on the backplane insulation layer, an outer edge of the backplane conducting layer is provided with a notch, the backplane insulation layer is provided with a first through hole, the first through hole includes a first sound hole disposed in a location corresponding to the notch, and the notch is in communication with the first sound hole. The present disclosure reduces stress concentration of the backplane and reducing a risk of structural failure such as breaking of the backplane.

12 Claims, 3 Drawing Sheets

MEMS MICROPHONE

CROSS-REFERENCE TO RELATED APPLICATIONS

This application claims the priority benefit of Chinese Patent Applications Ser. No. 201820210098.7 filed on Feb. 6, 2018, the entire content of which is incorporated herein by reference.

TECHNICAL FIELD

The present disclosure relates to electro-acoustic conversion field, and in particular, to an MEMS microphone.

BACKGROUND

In recent years, mobile communications technologies have developed rapidly. Customers use mobile communications devices more frequently, for example, a portable phone, a portable phone that can access the Internet, a personal digital assistant, and other devices performing communication by using a dedicated communications network. A microphone, especially a micro-electro-mechanical system (MEMS) microphone, is one of the most important components in mobile communications devices.

The MEMS microphone is an electric transducer manufactured by using a micromechanical processing technology and has features such as a small volume, a good frequency response feature, and low noise. As electronic devices become smaller and thinner, MEMS microphones are widely applied to the devices.

An MEMS microphone in the related art includes a substrate having a back cavity and a capacitor system fixedly disposed on the substrate. The capacitor system includes a backplane and a vibrating diaphragm that are spaced apart from each other. The backplane includes a backplane insulation layer and a backplane conducting layer disposed on the backplane insulation layer.

However, in the related art, an outer edge of the backplane conducting layer is flush, an outline of the outer edge of the backplane conducting layer does not pass through any backplane hole. In an MEMS processing process, a crack occurs at a boundary between the backplane conducting layer and the backplane insulation layer, easily causing structural failure such as breaking of the backplane.

Therefore, it is desired to provide an improved MEMS microphone to resolve the foregoing problem.

BRIEF DESCRIPTION OF THE DRAWINGS

To illustrate the technical schemes in the embodiments of the present disclosure, the following briefly describes the accompanying drawings required for describing the embodiments. Apparently, the accompanying drawings in the following description merely show some embodiments of the present disclosure, and a person of ordinary skill in the art can derive other drawings from these accompanying drawings without creative efforts.

DETAILED DESCRIPTION

The technical schemes of embodiments of the present disclosure are described clearly and completely in the following with reference to the accompanying drawings in the embodiments of the present disclosure. Apparently, the described embodiments are merely some embodiments of the present disclosure, rather than all embodiments. All other embodiments obtained by a person of ordinary skill in the art based on the embodiments of the present disclosure without creative efforts shall fall within the protection scope of the present disclosure.

Figure 1:
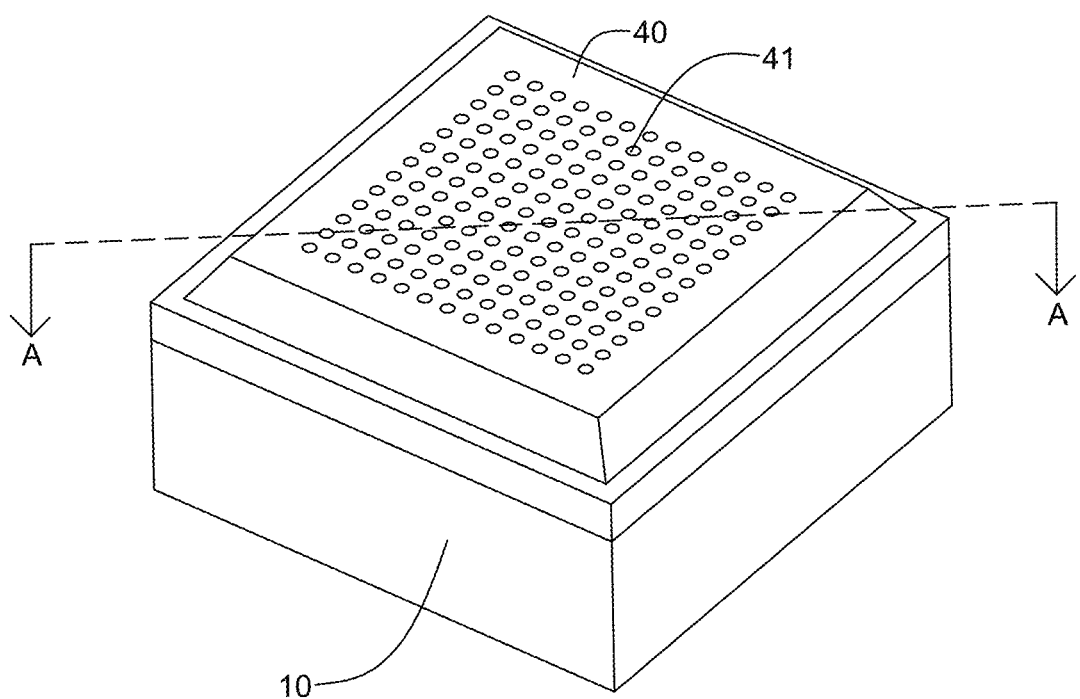
FIG. 1 is a schematic structural diagram of an MEMS microphone according to the present disclosure.
Figure 2:
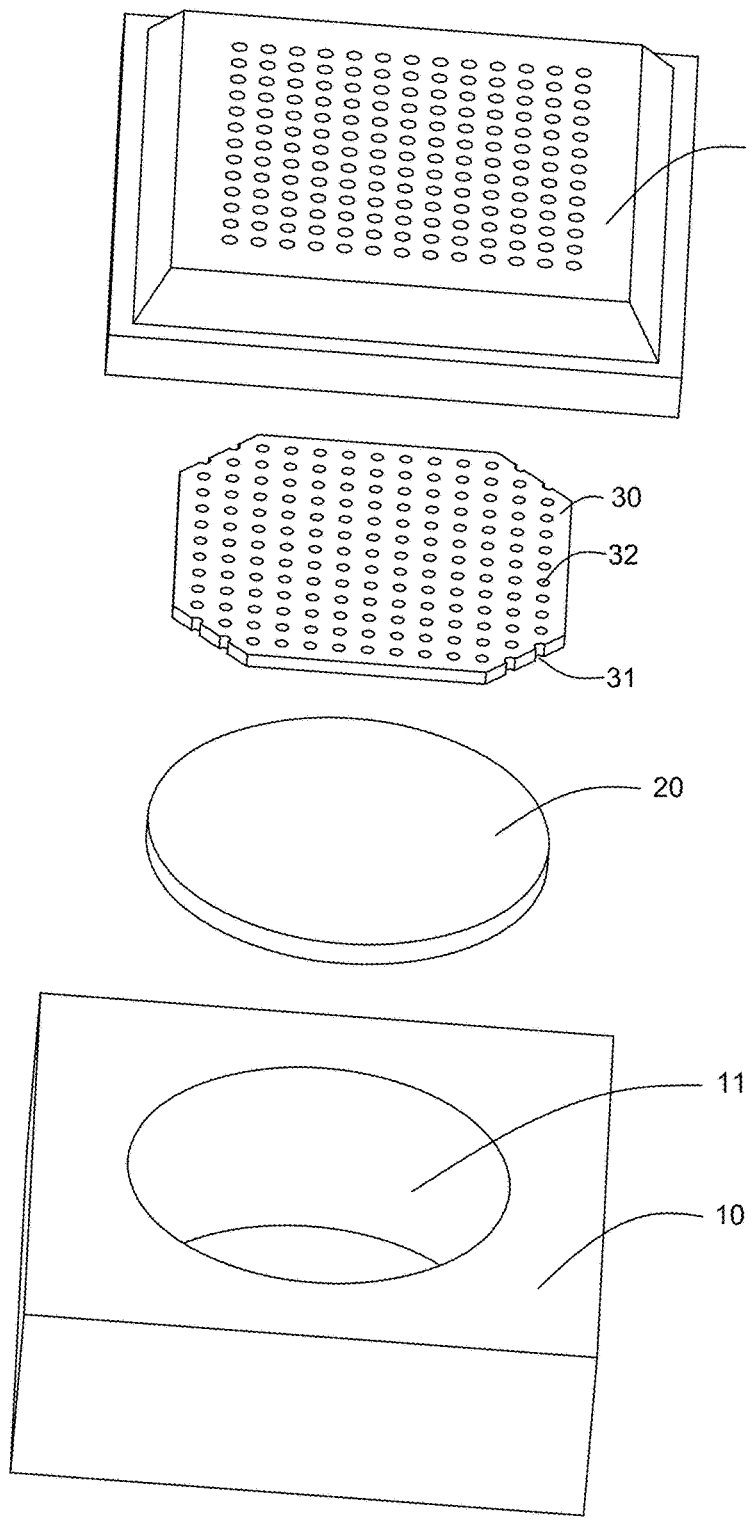
FIG. 2 is an exploded view of an MEMS microphone according to the present disclosure.

FIG. 1 to FIG. 2 shows an MEMS microphone 100 according to the present disclosure. The MEMS microphone 100 includes a substrate 10 having a back cavity 11 and a capacitor system 60 fixedly disposed on the substrate 10. The capacitor system 60 includes a backplane 50 and a vibrating diaphragm 20 that are spaced apart from each other. The backplane 50 is fixed to the substrate 10. The vibrating diaphragm 20 is located on a side of the backplane 50 close to the substrate 10, and in other implementations, may alternatively be located on a side of the backplane away from the substrate.

The backplane 50 includes a backplane insulation layer 40 and a backplane conducting layer 30 disposed on the backplane insulation layer 40. The backplane conducting layer 30 may be embedded in and fixed to a side of the backplane insulation layer 40 close to the substrate 10, or may be embedded in and fixed to a side of the backplane insulation layer away from the substrate. The backplane conducting layer 30 is smaller than the backplane insulation layer 40. The backplane conducting layer is fixed to the substrate 10 by the backplane insulation layer 40.

Figure 3:
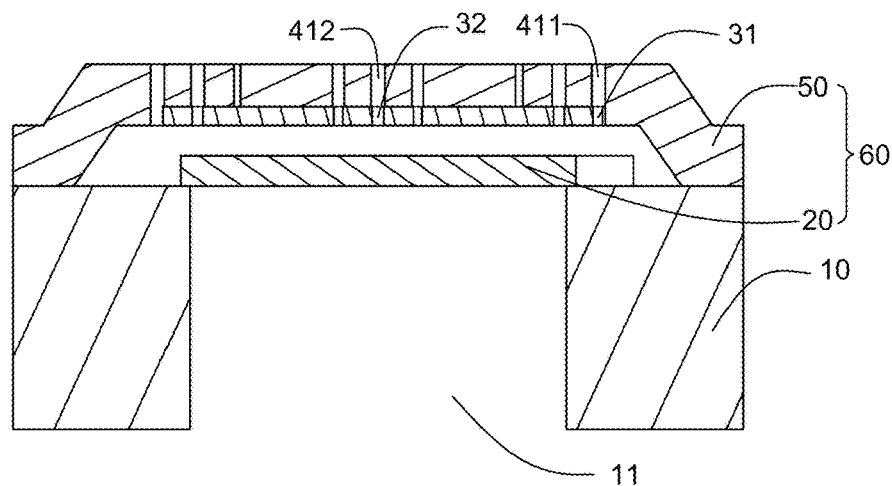
FIG. 3 is a cross-sectional view of FIG. 1 along a line A-A.
Figure 4:
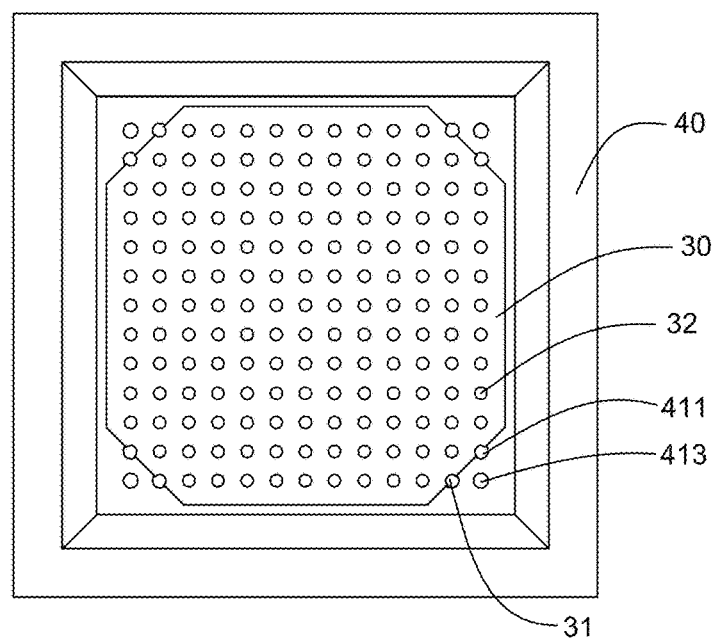
FIG. 4 is a schematic structural diagram of a backplane of an MEMS microphone according to the present disclosure.

Referring to FIG. 3 and FIG. 4, the backplane insulation layer 40 is provided with a first through hole 41. The first through hole 41 includes a first sound hole 411. The backplane conducting layer 30 includes a notch 31 provided on an outer edge. The first sound hole 411 is located in a location corresponding to the notch 31 and is in communication with the notch 31. That is, the first sound hole 411 and the notch 31 are provided at a boundary between the backplane insulation layer 40 and the backplane conducting layer 30. Therefore, a peripheral outline of the backplane conducting layer 30 passes through the first sound hole 411 of the backplane insulation layer, thereby reducing stress concentration of the backplane 50 and reducing a risk of structural failure such as breaking of the backplane 50. A plurality of notches 31 are provided, and a plurality of first sound holes 411 are correspondingly provided.

In addition, the first through hole 41 of the backplane insulation layer 40 further includes a second sound hole 412 and a third sound hole 413. The backplane conducting layer 30 is provided with a second through hole 32. The second sound hole 412 corresponds to and is in communication with the second through hole 32. The second sound hole 412 and the second through hole 32 are configured to intake a sound, so that an external sound arrives at a vibrating diaphragm after sequentially passing through the second sound hole and the second through hole. The third sound hole 413 is located on an outer side of the backplane conducting layer 30, and may be used as a sound hole or may be used as a vent hole.

The foregoing descriptions are merely implementations of the present disclosure. It should be noted that a person of ordinary skill in the art can make improvements without departing from the inventive concept of the present disclosure, and all the improvements shall fall within the protection range of the present disclosure.

What is claimed is:

1. A micro-electro-mechanical (MEMS) microphone, comprising a substrate having a back cavity and a capacitor system fixedly disposed on the substrate, wherein the capacitor system comprises a backplane and a vibrating diaphragm that are spaced apart from each other, the backplane comprises a backplane insulation layer and a backplane conducting layer disposed on the backplane insulation layer, an outer edge of the backplane conducting layer is provided with a notch, the backplane insulation layer is provided with a first through hole, the first through hole comprises a first sound hole disposed in a location corresponding to the notch, and the notch is in communication with the first sound hole.

2. The MEMS microphone according to claim 1, wherein a plurality of notches are provided, and a plurality of first sound holes are correspondingly provided.

3. The MEMS microphone according to claim 1, wherein the backplane conducting layer is provided with a second through hole, the first through hole further comprises a second sound hole corresponding to the second through hole, and the second sound hole is in communication with the second through hole.

4. The MEMS microphone according to claim 1, wherein the first through hole further comprises a third sound hole, the third sound hole being located on an outer side of the backplane conducting layer.

5. The MEMS microphone according to claim 1, wherein the vibrating diaphragm is located on a side of the backplane close to the substrate.

6. The MEMS microphone according to claim 1, wherein the vibrating diaphragm is located on a side of the backplane away from the substrate.

7. The MEMS microphone according to claim 5, wherein the backplane insulation layer is fixed to the substrate.

8. The MEMS microphone according to claim 6, wherein the backplane insulation layer is fixed to the substrate.

9. The MEMS microphone according to claim 7, wherein the backplane conducting layer is embedded in and fixed to a side of the backplane insulation layer close to the substrate.

10. The MEMS microphone according to claim 8, wherein the backplane conducting layer is embedded in and fixed to a side of the backplane insulation layer close to the substrate.

11. The MEMS microphone according to claim 7, wherein the backplane conducting layer is embedded in and fixed to a side of the backplane insulation layer away from the substrate.

12. The MEMS microphone according to claim 8, wherein the backplane conducting layer is embedded in and fixed to a side of the backplane insulation layer away from the substrate.

* * * * *

UNITED STATES PATENT AND TRADEMARK OFFICE
CERTIFICATE OF CORRECTION

PATENT NO. : 10,582,307 B2
APPLICATION NO. : 16/234567
DATED : March 3, 2020
INVENTOR(S) : Yang Bai et al.

Page 1 of 1

It is certified that error appears in the above-identified patent and that said Letters Patent is hereby corrected as shown below:

On the Title Page

Item (73) Line 1 to Line 2, the assignee's name and location reading:
-AAC Technologies Pte. Ltd., Singapore (SG)-
Should be changed to:
-AAC Acoustic Technologies (Shenzhen) Co., Ltd., Shenzhen (CN)-

Signed and Sealed this
Fifteenth Day of September, 2020

Andrei Iancu
*Director of the United States Patent and Trademark Office*